United States Patent
Bleeker et al.

(10) Patent No.: US 6,778,257 B2
(45) Date of Patent: Aug. 17, 2004

(54) IMAGING APPARATUS

(75) Inventors: Arno Jan Bleeker, Westerhoven (NL); Pieter Willem Herman De Jager, Rotterdam (NL); Jason Douglas Hintersteiner, Bethel, CT (US); Borgert Kruizinga, Zoetermer (NL); Matthew Eugene McCarthy, Brookfield, CT (US); Mark Oskotsky, Mamaroneck, NY (US); Lev Ryzhikov, Norwalk, CT (US); Lev Sakin, Stamford I, CT (US); Stanislav Smirnov, Bethel, CT (US); Bart Snijders, Rotterdam (NL); Karel Diederick Van Der Mast, Helmond (NL); Huibert Visser, Zevenhuizen (NL)

(73) Assignee: ASML Netherlands B.V. (NL)

( * ) Notice: Subject to any disclaimer, the term of this patent is extended or adjusted under 35 U.S.C. 154(b) by 0 days.

(21) Appl. No.: 10/200,577

(22) Filed: Jul. 23, 2002

(65) Prior Publication Data

US 2003/0030781 A1 Feb. 13, 2003

(30) Foreign Application Priority Data

Jul. 24, 2001 (EP) .......................................... 01202825

(51) Int. Cl.[7] ........................ G03B 27/54; G03B 27/42; G03B 27/32; G03B 21/26
(52) U.S. Cl. .............................. 355/67; 355/53; 355/77; 353/30
(58) Field of Search .............................. 355/67, 53, 41, 355/46, 77; 430/5, 30; 359/618, 224, 872; 250/492.22; 353/30; 347/239

(56) References Cited

U.S. PATENT DOCUMENTS

| 4,497,013 | A | 1/1985 | Ohta |
| 5,016,149 | A | 5/1991 | Tanaka et al. |
| 5,153,773 | A | 10/1992 | Muraki et al. |
| 5,674,414 | A | 10/1997 | Schweizer |
| 5,691,541 | A | 11/1997 | Ceglio et al. |
| 6,055,039 | A | 4/2000 | Hayata |
| 6,233,039 | B1 | 5/2001 | Yen et al. |
| 2002/0021426 | A1 * | 2/2002 | Mei et al. ...................... 355/53 |
| 2003/0086177 | A1 * | 5/2003 | Kowarz et al. .............. 359/618 |

FOREIGN PATENT DOCUMENTS

| DE | 195 34 165 | 5/1996 |
| EP | 0 939 341 A2 | 9/1999 |

* cited by examiner

Primary Examiner—Peter B. Kim
(74) Attorney, Agent, or Firm—Pillsbury Winthrop LLP

(57) ABSTRACT

An imaging apparatus according to one embodiment of the invention includes a programmable patterning structure configured to pattern a projection beam of radiation according to a desired pattern. The programmable patterning structure includes a plurality of separate patterning sub-elements, each sub-element being configured to generate a patterned sub-beam. At least one of the separate patterning sub-elements is configured to generate a patterned sub-beam whose cross-section contains regions of different intensities. The imaging apparatus also includes a combining structure configured to combine the plurality of patterned sub-beams into a single patterned image, and a projection system configured to project the patterned image onto a target portion of a substrate.

28 Claims, 11 Drawing Sheets

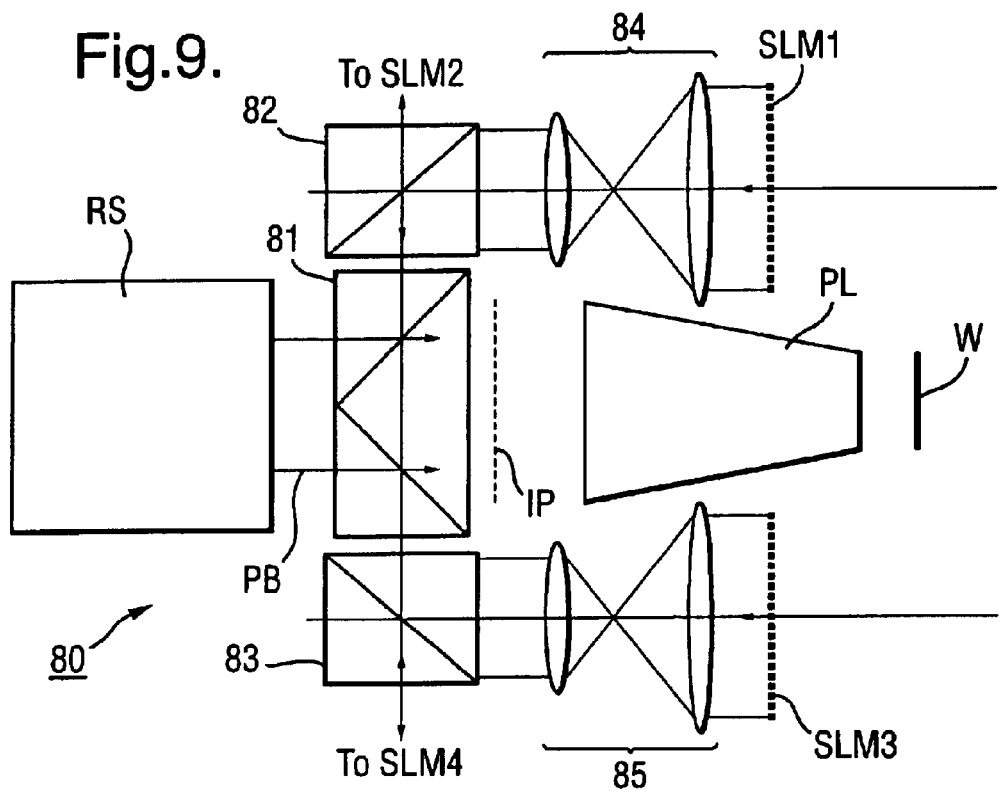
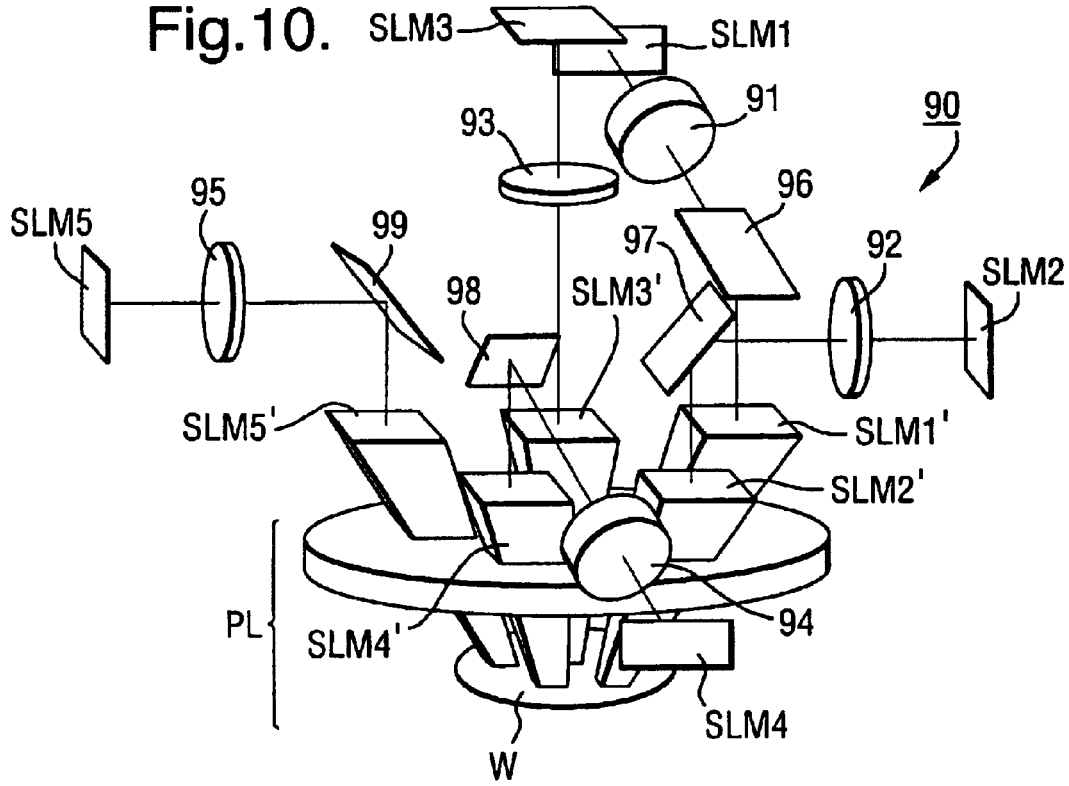

Fig.17.
Fig.18.
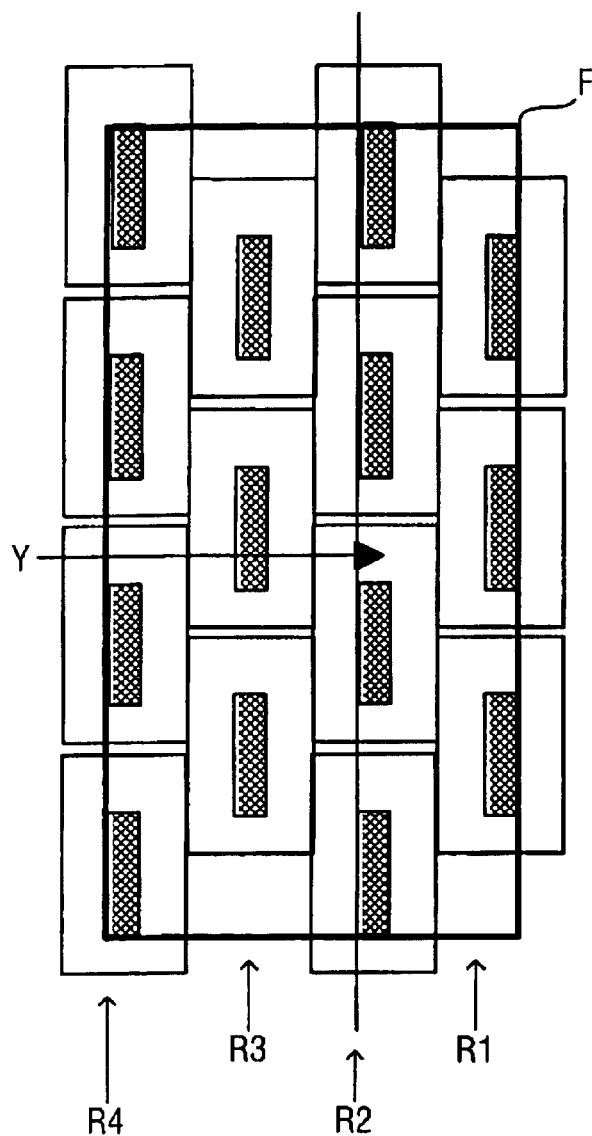
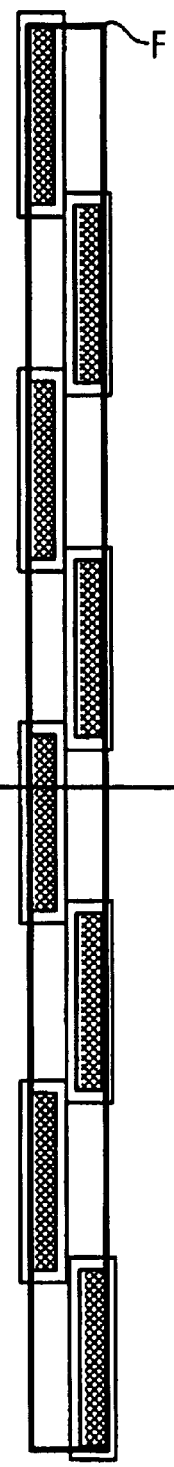

IMAGING APPARATUS

RELATED APPLICATIONS

This application claims priority to European Patent Application EP 01202825.4, which document is herein incorporated by reference.

FIELD OF THE INVENTION

The present invention relates to imaging, especially projection imaging.

BACKGROUND

The term "programmable patterning structure" as here employed should be broadly interpreted as referring to any programmable structure or field that may be used to endow an incoming radiation beam with a patterned cross-section, corresponding to a pattern that is to be created in a target portion of a substrate; the term "light valve" can also be used in this context. Generally, such a pattern will correspond to a particular functional layer in a device being created in the target portion, such as an integrated circuit or other device (see below). Examples of such programmable patterning structure include:

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of very small (possibly microscopic) mirrors, each of which can be individually tilted about an axis by applying a suitable localized electric field, or by employing piezoelectric actuation structure. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic structure. In both of the situations described hereabove, the patterning structure can comprise one or more programmable mirror arrays. More information on mirror arrays as here referred to can be gleaned, for example, from U.S. Pat. Nos. 5,296,891 and 5,523,193, which documents are herein incorporated by reference, and PCT patent applications WO 98/38597 and WO 98/33096, which documents are herein incorporated by reference. In the case of a programmable mirror array, the support structure may be embodied as a frame or table, for example, which may be fixed or movable as required.

A programmable LCD array. An example of such a construction is given in U.S. Pat. No. 5,229,872, which document is herein incorporated by reference. As above, the support structure in this case may be embodied as a frame or table, for example, which may be fixed or movable as required.

An imaging apparatus is currently employed to make mask writing machines (e.g. by the Swedish firm Micronic). The substrate in such a mask writing machine is, for example, a metallized plate (e.g. a Cr-coated quartz or $CaF_2$ plate) that has been coated with a layer of photoresist. The idea behind such a mask writing machine is that an electronic file of the mask pattern (which pattern is typically highly complex) is used to matrix-address the patterning structure, which then diverts a patterned radiation beam onto a small portion of the mask plate. By changing the pattern in the patterned beam in accordance with the electronic file, and concurrently moving the beam over the whole surface of the mask plate (in either a scanning or a stepping motion), the final mask pattern is built up as a sum of combined juxtaposed) sub-patterns from the patterned beam. For this reason, such a machine is sometimes referred to as a "mask writer". A mask as produced by such an apparatus can be used in a lithographic projection apparatus, which repetitively images the mask pattern onto a photo-sensitive substrate—such as a photoresist-coated semiconductor (e.g. Si, Ge, GaAs, SiGe) wafer—as part of the broader manufacturing process involved in producing integrated devices, such as integrated circuits (ICs).

One factor limiting a wider use of mask writing techniques in lithographic projection practices (e.g. for direct writing to a substrate) is the very low throughput: whereas current direct-write machines might be expected to achieve a throughput on the order of one substrate per day, a state-of-the-art lithographic projection apparatus has a throughput of the order of 100 substrates per hour. Therefore, use of mask writing techniques for direct writing to a substrate is currently limited to those cases in which the cost of enduring a long writing process for each wafer is less than the cost of preparing a special mask for a low-quantity production run.

SUMMARY

An imaging apparatus according to one embodiment of the invention includes a programmable patterning structure configured to pattern a projection beam of radiation according to a desired pattern. The programmable patterning structure includes a plurality of separate patterning sub-elements, each sub-element being configured to generate a patterned sub-beam. At least one of the separate patterning sub-elements is configured to generate a patterned sub-beam whose cross-section contains regions of different intensities. The imaging apparatus also includes a combining structure configured to combine the plurality of patterned sub-beams into a single patterned image, and a projection system configured to project the patterned image onto a target portion of a substrate.

A device manufacturing method according to another embodiment of the invention includes using a radiation system to provide a projection beam of radiation and generating a plurality of patterned sub-beams based on the projection beam. At least one of the sub-beams has a cross-section that contains regions of different intensities. The method also includes combining the plurality of patterned sub-beams into a single patterned image, and projecting the patterned image onto a target portion of a layer of radiation-sensitive material that at least partially covers a substrate.

BRIEF DESCRIPTION OF THE DRAWINGS

Embodiments of the invention will now be described, by way of example only, with reference to the accompanying schematic drawings in which:

FIG. 9 depicts part of the optical system of an imaging apparatus according to a eighth embodiment of the invention;

FIG. 10 depicts part of the optical system of an imaging apparatus according to a ninth embodiment of the invention;

FIG. 17 depicts the arrangement of plural programmable patterning structure in an imaging apparatus according to a fifteenth embodiment of the invention;

FIG. 18 depicts the arrangement of plural programmable patterning structure in an imaging apparatus according to a sixteenth embodiment of the invention;

In the Figures, corresponding reference symbols indicate corresponding parts.

DETAILED DESCRIPTION

Figure 1:
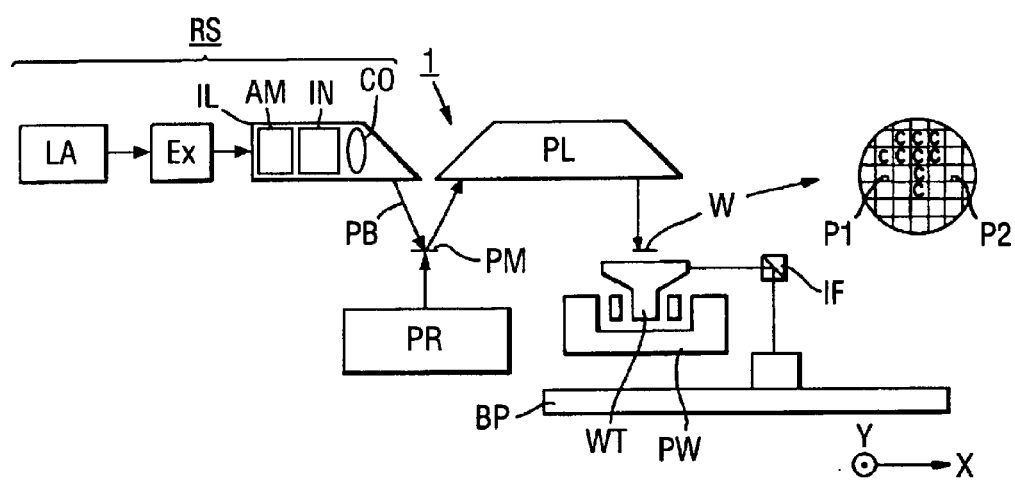
FIG. 1 depicts an imaging apparatus in conjunction with which an embodiment of the current invention can be employed.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake, and measurement/inspection of the imaged features. This array of procedures is used as a basis to pattern an individual layer of a device (e.g. an IC). Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although mask writing machines as described above have heretofore been used only in the manufacture of masks, it is possible—at least in principle—to use them in the manufacture of semiconductor and other integrated devices. In such a case, the mask plate would be replaced by, for example, a semiconductor wafer, and the pattern built up on the wafer by the patterning structure would correspond to an array of die patterns.

As noted above, however, a major drawback of such an application would be its very low throughput: whereas current direct-write machines might be expected to achieve a throughput of the order of one substrate per day, a state-of-the-art lithographic projection apparatus has a throughput of the order of 100 substrates per hour. Nevertheless, it might still be interesting to pursue such an application under certain circumstances. For example, in the case of a foundry making a small batch of a particular integrated device (such as a dedicated ASIC), it might be more attractive to endure a slow direct-write process as delivered by a machine as described above rather than to entail the very high costs (often of the order of $50,000–100,000) of making a special mask for the batch in question. At the moment, such a choice might only be commercially viable in the case of a very small batch of a very expensive device; however, it would become much more attractive if the throughput of direct-write machines could be increased. More information with regard to conventional lithographic apparatus as here described can be gleaned, for example, from U.S. Pat. No. 6,046,792, incorporated herein by reference.

FIG. 1 schematically depicts an imaging apparatus in conjunction with which an embodiment of the current invention can be employed. The apparatus comprises:

A radiation system configured to supply (e.g. having structure capable of supplying) a projection beam of radiation (e.g. UV or EUV radiation). In this particular example, the radiation system RS comprises a radiation source LA, a beam expander Ex, and an illumination system including adjusting structure AM for setting an illumination node, an integrator IN, and condensing optics CO;

Patterning structure PM, comprising a Spatial Light Modulator (SLM) and pattern rasterizer PR (for matrix-addressing the SLM);

A substrate table WT configured to hold a substrate W (e.g. a resist-coated semiconductor wafer). In this example, table WT is connected to interferometric measurement and positioning structure IF, which is configured to accurately position the substrate with respect to lens PL;

A projection system ("lens") configured to project the patterned beam. In this example, projection system PL (e.g. a refractive lens system) is configured to image the beam PB onto a target portion C (e.g. comprising one or more dies) of the substrate W.

The term "projection system" should be broadly interpreted as encompassing various types of projection system, including refractive optics, reflective optics, and catadioptric systems, for example. For the sake of simplicity, the projection system may hereinafter be referred to as the "lens". The radiation system may also include components operating according to any of these design types for directing, shaping, reducing, enlarging, patterning, and/or otherwise controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

It should be noted with regard to FIG. 1 that the source LA may be within the housing of imaging apparatus (as is often the case when the source LA is a mercury lamp, for example), but that it may also be remote from the lithographic projection apparatus, the radiation beam which it produces being led into the apparatus, e.g. with the aid of suitable directing mirrors. This latter scenario is often the case when the source LA is an excimer laser. The current invention and claims encompass both of these scenarios.

Having traversed the SLM, the beam PB passes through the lens PL, which focuses the beam PB onto a target portion C of the substrate W. With the aid of the interferometric measuring and positioning structure IF, the substrate table WT can be moved accurately, e.g. so as to position different target portions C in the path of the beam PB. In general, movement of the substrate table WT will be realized with the aid of a long-stroke module (coarse positioning) and a short-stroke module (fine positioning), which are not explicitly depicted in FIG. 1. The substrate W may, for example, a quartz plate onto which a mask pattern is to be written, or a silicon (or other semiconductor) wafer onto which an array of device dies is to be imaged.

Figure 2:
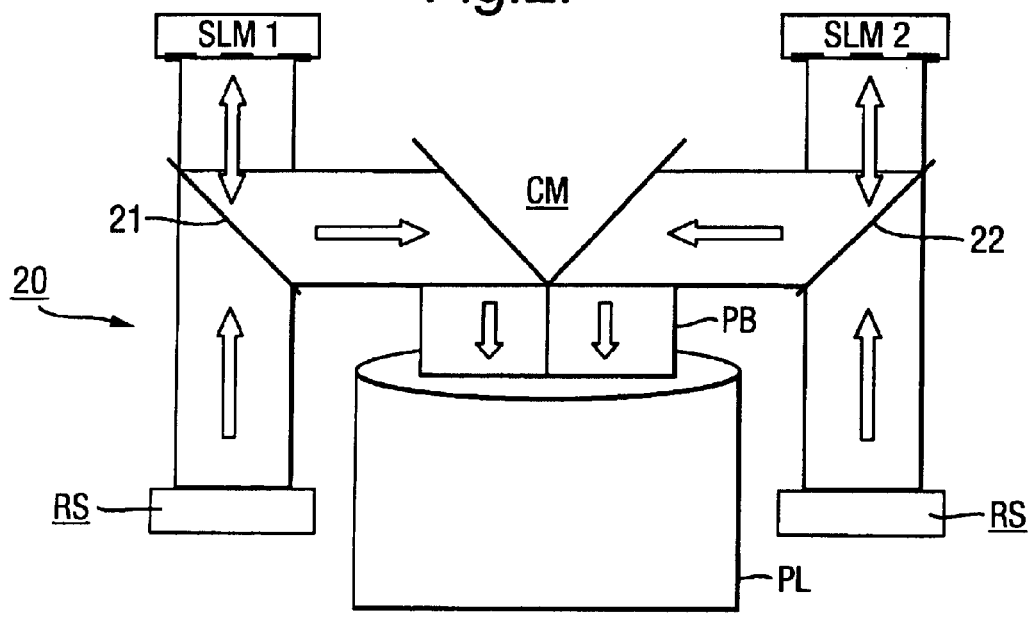
FIG. 2 depicts part of the optical system of an imaging apparatus according to a first embodiment of the invention.

FIG. 2 depicts part of an imaging apparatus 20 according to an embodiment of the present invention. Light from the radiation system RS is directed onto two spatial light modulators SLM1, SLM2, via beam splitters 21, 22. The patterned light reflected from the two spatial light modulators SLM1, SLM2 is then directed by the beam splitters 21, 22 onto combining structure CM. In this instance, the combining structure CM takes the form of reflectors that direct the sub-beams from the separate SLMs and combines them into a single beam PB. By introducing additional optics in the beam paths between the SLMs and the projection system PL (which system PL may be demagnifying), the patterned sub-beams can be made smaller at the entrance of the projection system. Such a reduction will create more space for the mirror system CM and also for the SLMs. Also, the sub-beam branches do not have to be at the same height; such an arrangement would again allow more space to be created for the mirror optics. For the sake of simplicity, only two SLM branches are shown in this Figure; however, more can be added if desired.

Figure 3:
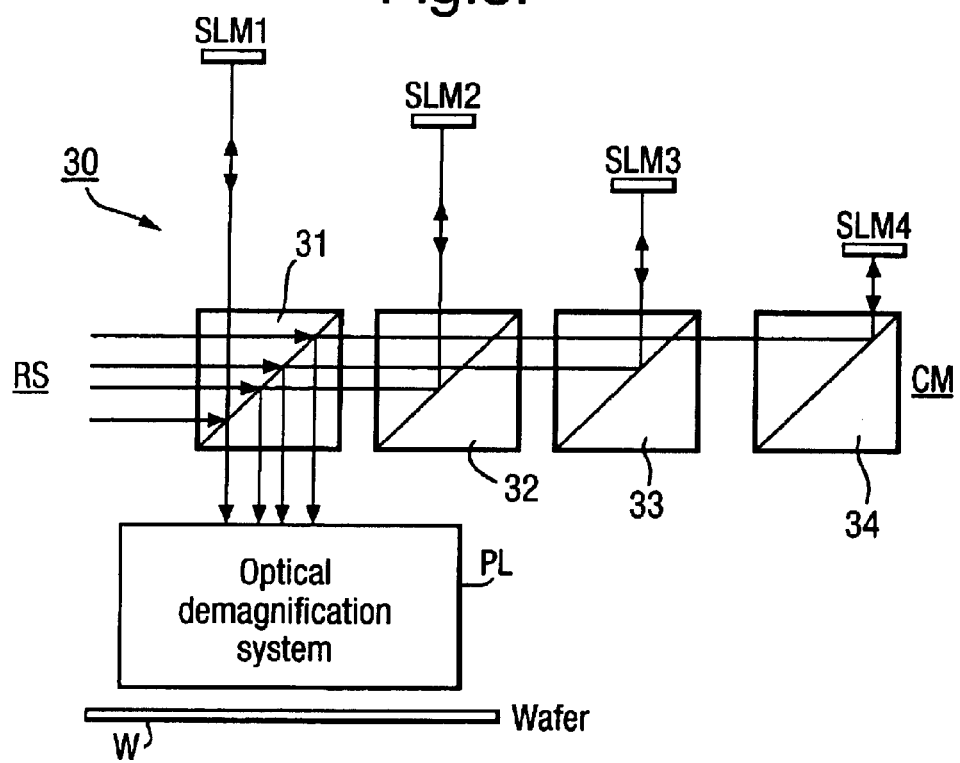
FIG. 3 depicts part of the optical system of an imaging apparatus according to a second embodiment of the invention.

FIG. 3 depicts part of an imaging apparatus 30 according to a second embodiment of the present invention. This figure shows one way to combine the sub-beams from four spatial light modulators SLM1 to SLM4 into a single image, though the same principle can be extended to numbers other than four. In this case, the combining structure CM comprises an array of beam-splitting mirror blocks 31–34. The optical path length between each SLM and the demagnifying projection system PL should be the same if no additional optical elements are used. Introduction of optical elements between the SLMs and mirror blocks and/or between the mirror blocks 31–34 themselves can add design flexibility.

Figure 4:
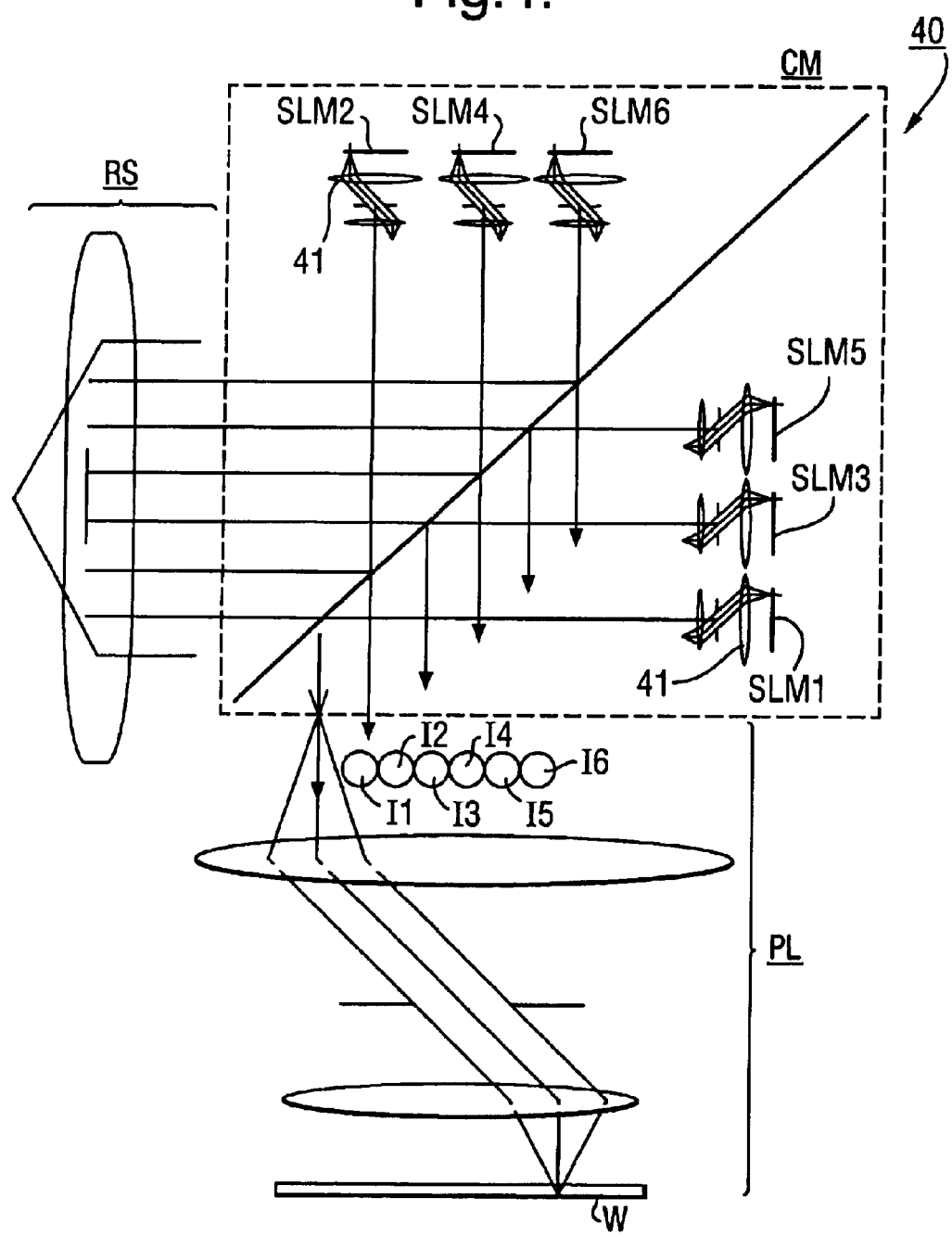
FIG. 4 depicts part of the optical system of an imaging apparatus according to a third embodiment of the invention.

FIG. 4 depicts part of an imaging apparatus 40 according to a third embodiment of the present invention. The spatial light modulators SLM1 to SLM6 are arranged in two rows that have been placed in the two paths of a beam splitter, acting as combining structure CM. The reflected beams from the spatial light modulators SLM1 to SLM6 are combined such that the structures are aligned at what would be the plane of the mask in a conventional lithographic projection apparatus. An intermediate image is created at this plane, allowing the projection optics PL of the apparatus to be used. For each of the spatial light modulators SLM1 to SLM6, an optical system 41 is provided to create the images I1 to I6 at the object plane of the projection system PL.

If the mirrors of the SLM have to be demagnified by a factor of, e.g., 320, a part of this factor (for example, a factor of 4) may be realized in the projection optics PL. The remaining demagnification factor (here, 80) can then be realized in the optical system 41 of each of the channels for the individual spatial light modulators SLM1 to SLM6. Moreover, the contrast aperture (spatial filter) can be placed in these sub-beams.

Figure 5:
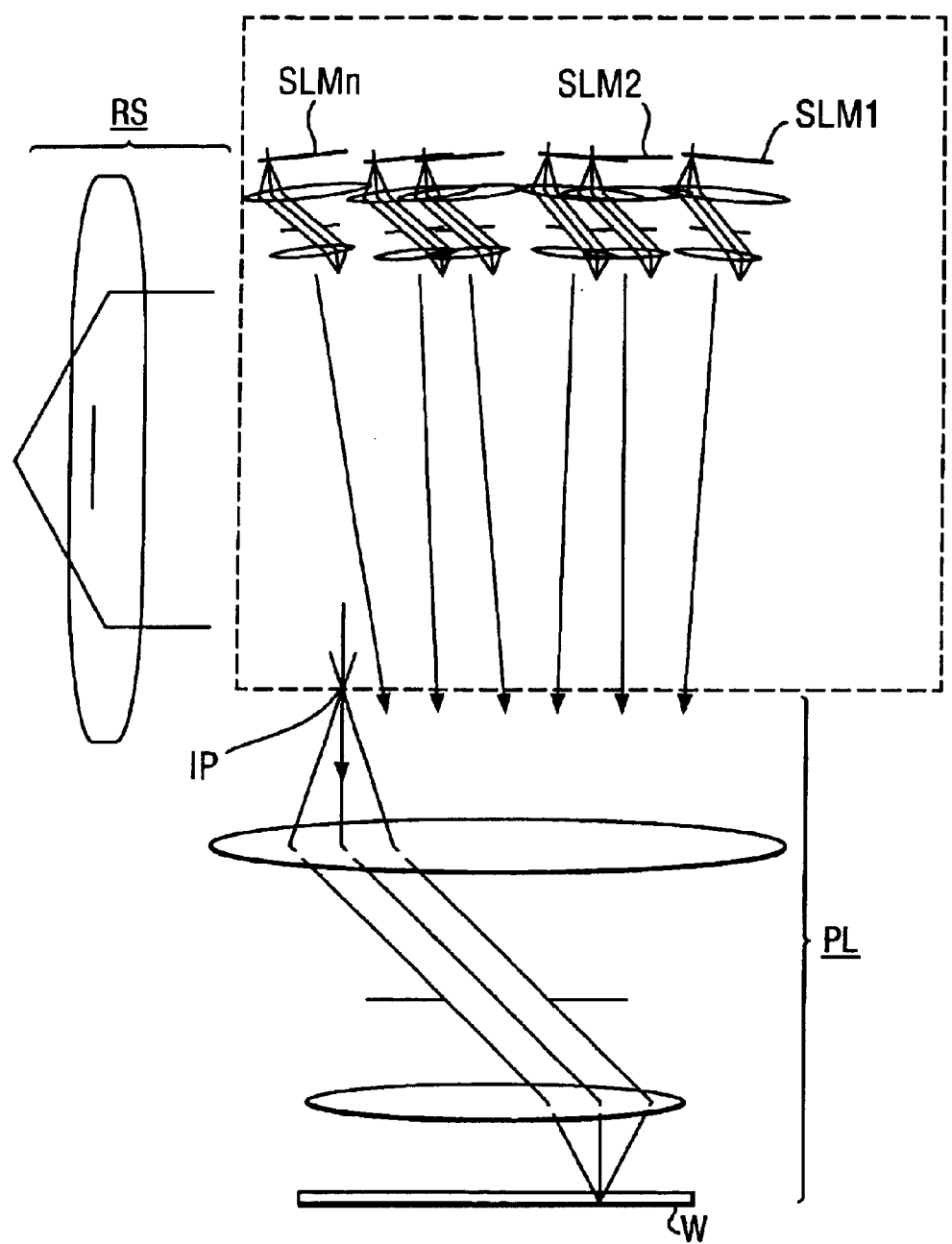
FIG. 5 depicts part of the optical system of an imaging apparatus according to a fourth embodiment of the invention.

FIG. 5 depicts part of the operation of an imaging apparatus according to a fourth embodiment of the present invention. The spatial light modulators SLM1 to SLM-n are positioned in a fan configuration. The images of the SLMs are formed in a plane IP at what would be the position of the mask in a conventional lithographic projection apparatus. With Scheimpflug optics in the optical system connected to each SLM, it is possible to create an image in a plane even though the objects themselves (the SLMs) are not in a plane.

Several fans can be positioned in this scenario (e.g. perpendicular to the plane of the drawing). Two fans have been indicated in the drawing, but more levels are possible. In general, the SLMs are positioned on a ball-shaped surface. A projection optics system PL re-images the images in plane IP onto the substrate W, e.g. with a reduction by a factor of 4.

Elements of the third and fourth embodiments can be combined. The layout of the system within the dotted box of FIG. 5 then includes a central beam splitter, with spatial light modulators positioned both above and to the right on respective curved surfaces. An optical system positioned directly below (or beside) each SLM includes Scheimpflug optics, a filter aperture, and possibly other components.

The following calculation example demonstrates how the entire width of a die may be filled in a single scan: To provide a 25 mm image at the wafer, with 100 nm pixels, indicates $250 \times 10^3$ pixels. Each pixel is printed with 2 mirrors in each direction, yielding $500 \times 10^3$ mirrors in a non-scan direction. State-of-the-art SLMs have 2048×512 mirrors, so at least 250 SLMs have to be combined, or 125 in each of the two directions of the beam splitter. If positioned in a row, this would mean a row of more than 8 meters (for 16 $\mu$m mirrors and 50% of the chip area filled with mirrors), which may not be a very practical solution. Alternatively, supposing 10 curved levels, an area of about 80×80 cm² may be filled with SLMs, with a packing density of 50%, for a more practical result. The slit width during scanning is about 25 μm.

Figure 6:
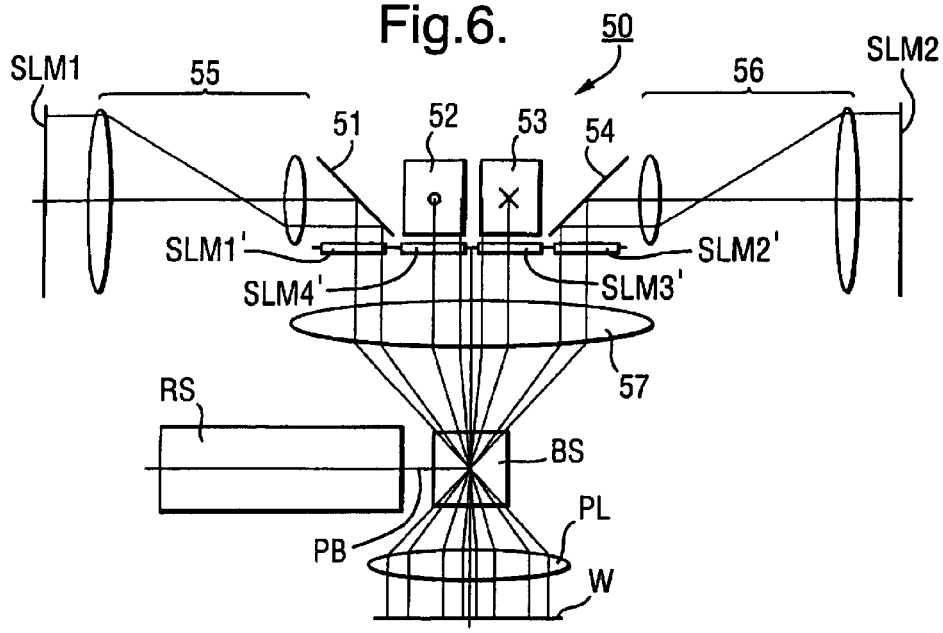
FIG. 6 depicts part of the optical system of an imaging apparatus according to a fifth embodiment of the invention.

FIG. 6 depicts part of a lithographic apparatus 50 according to a fifth embodiment of the invention which uses four spatial light modulators. The projection beam PB provided by radiation system RS is directed by beam splitter BS into coupling lens 57 which expands the beam. Four folding mirrors 51–54 then direct radiation into separate optical channels for each of the spatial light modulators. For clarity, only two spatial light modulators SLM1, SLM2 and their respective optical channels 55,56 are shown. The third and fourth spatial light modulators and their optical channels are positioned below and above the page of the drawing (e.g. as indicated by the markings on mirrors 52,53). The separate optical channels (e.g. 55,56) focus the patterned beams reflected by the spatial light modulators to form reduced images SLM1'–SLM4' adjacent to each other in a plane. Those images are then re-imaged on the substrate W by coupling lens 57 and the projection lens PL, with a further reduction.

Figure 7:
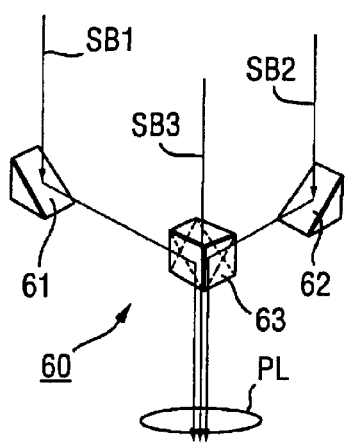
FIG. 7 depicts part of the optical system of an imaging apparatus according to a sixth embodiment of the invention.

FIG. 7 depicts a part of the optical system 60 of a lithographic apparatus according to a sixth embodiment which is adapted to combine three sub-beams with low intensity losses. The three patterned sub-beams SB1–SB3 are combined by three-way beam splitter 63, sub-beams SB1 and SB2 having been directed into side faces of three-way beamsplitter TS by folding mirrors 61,62. This arrangement minimizes the number of reflections to combine three beams and hence minimizes reflection and polarization losses.

Figure 8:
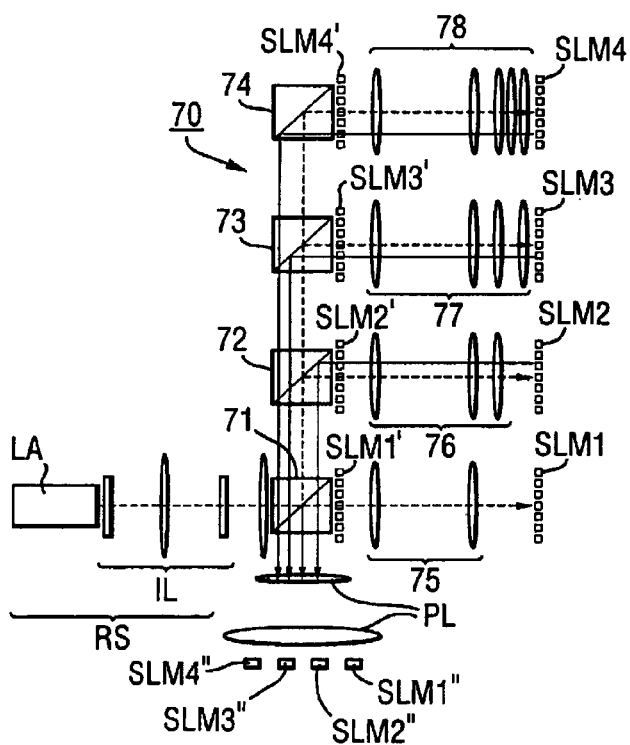
FIG. 8 depicts part of the optical system of an imaging apparatus according to a seventh embodiment of the invention.

FIG. 8 depicts part of the optical system 70 of a seventh embodiment of the invention, which is similar to the third embodiment in using beam splitters 71–74 to combine the patterned sub-beams from four spatial light modulators SLM1–SLM4. The radiation system RS, comprising source LA (e.g. an excimer laser) and illumination system IL, delivers a collimated projection beam which is split and directed onto the spatial light modulators SLM1–SLM4 by the beam splitters 71–74. The reflected, patterned sub-beams are imaged as SLM1'–SLM4' by separate optical systems 75–78 at the entrances to the respective ones of the beam splitters 71–74. The separate optical system 75–78 compensate for the different optical path lengths of the different branches of the system and may include some reduction, e.g. by a factor of 16 or 20. The projection system PL then re-images the images SLM1'–SLM4' with a reduction (e.g. by a factor of 16 or 20) on the substrate as SLM1"–SLM4".

FIG. 9 depicts part of the optical system 80 of an eighth embodiment of the invention which is arranged so that each branch involves the same number of passes through beam splitters. The projection beam PB output by radiation system RS is divided in two by first beam splitter 81. The two sub-beams produced by beamsplitter 81 are each further divided in two by second and third beamsplitters 82, 83 and directed to the spatial light modulators SLM1–SLM4 (for clarity, only SLM1 & SLM3 are shown). The patterned sub-beams returning from the spatial light modulators are re-imaged by respective relay systems 84, 85 (only two shown for clarity) via the beam splitters 81–83 in an image plane IP, which also forms the object plane of the projection lens PL. The relay systems 84, 85, which form separate optical channels for the respective spatial light modulators, preferably reduce the images of the spatial light modulators; further reduction may be effected in the projection system PL.

FIG. 10 depicts a part of the optical system 90 of a lithographic projection apparatus according to a ninth embodiment of the invention. Five spatial light modulators SLM1–SLM5 are used and have respective optical systems 91–95 and folding mirrors 96–99 that create images SLM1'–SLM5' in the object plane of projection system PL. The projection system PL projects a reduced image of the spatial light modulators SLM1–SLM5 onto the substrate W.

Figure 11:
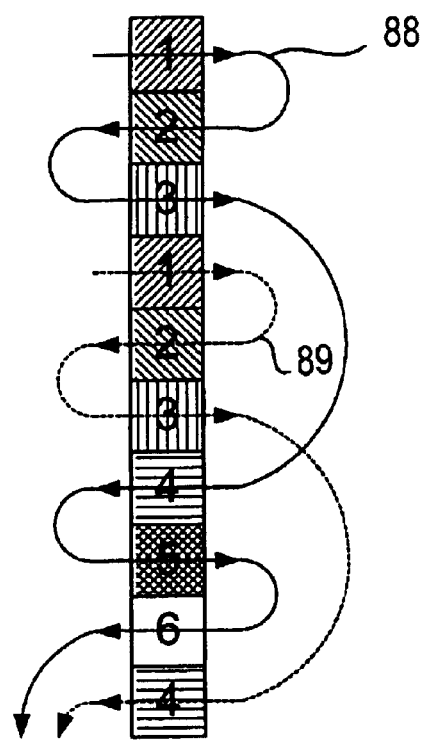
FIG. 11 depicts a scanning scheme of an imaging apparatus according to a tenth embodiment of the invention.

In an apparatus according to a tenth embodiment of the invention, which may employ an optical system as used in any of the embodiments described above, the spatial light modulators, respective optical systems, and projection system PL are arranged so that on the substrate, the gap between images of the spatial light modulators is exactly equal to an integer multiple of the height of a spatial light modulator. A lithographic apparatus according to such an embodiment therefore uses a scanning scheme that is explained with reference to FIG. 11. FIG. 11 illustrates a scanning scheme for the example of an apparatus with two spatial light modulators in which the images of the spatial light modulators are spaced apart by two array widths on the substrate. The substrate is moved along a meander path such that the images of the spatial light modulators follow the paths labeled 88, 89 in the figure. Thus, first the two target areas labeled 1 are imaged, then the adjacent areas labeled 2, then the areas labeled 3 to fill the gap between the two areas first imaged. Next, the substrate is stepped by a distance equal to four times the width of an image of one of the spatial light modulators so that areas 4 are imaged. The cycle then repeats to image areas 5 and 6, etc.

Figure 12:
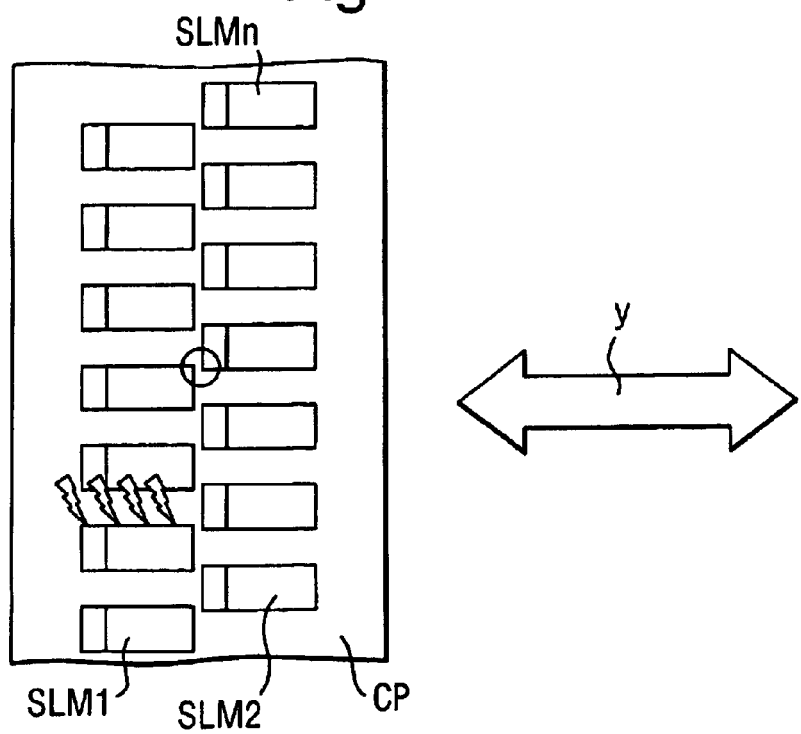
FIG. 12 depicts the arrangement of plural programmable patterning structure in an imaging apparatus according to an eleventh embodiment of the invention.

FIG. 12 depicts a carrier plate CP holding multiple spatial light modulators SLM1–SLMn in an imaging apparatus according to an eleventh embodiment of the present invention. Each of the spatial light modulators consists of, for example, an array of 3,000 by 1,000 mirrors, each 4 μm square.

The working of the combining structure in this instance is such that the SLMs are placed on a carrier plate CP and imaged onto a substrate with a conventional projection system (not depicted). By arranging the SLMs on the carrier plate in a staggered pattern, the full area of the substrate can be exposed. Adjacent rows of spatial light modulators are placed so that there is an overlap between SLMs in the direction perpendicular to the scanning direction Y, the size of the overlap being determined by the placement accuracy of the SLMs. The substrate image is preferably built up from a number of sub-exposures (e.g. 4), so as to reduce the possible effects of dose errors. Accordingly, in this example the radiation source is pulsed every time the carrier plate has moved one-quarter of the length of the SLM. For the final group of pixels in each SLM, the illumination is attenuated to allow control of the dose delivered at substrate level. The optical field is limited by the maximum radius of the first lens element in front of the SLM; in the case of conventional lithographic projection apparatus lenses, this value will be of the order of about 10 cm.

Figure 13:
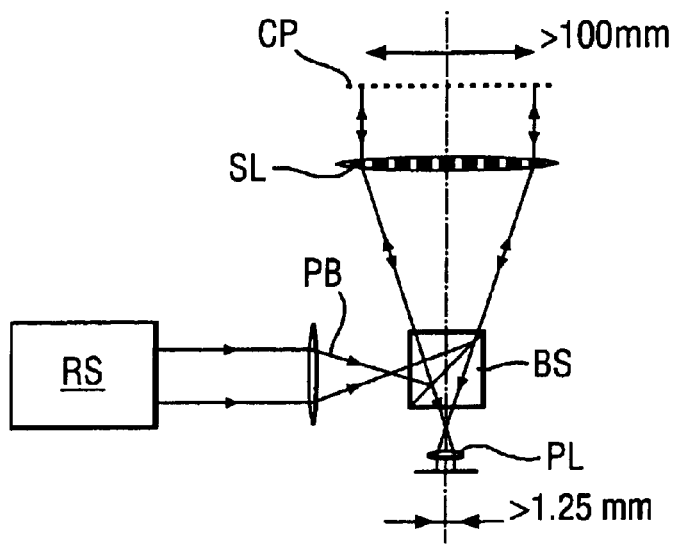
FIG. 13 illustrates the segmented lens concept of an imaging apparatus according to the eleventh embodiment.

Since not all the area of the carrier plate CP is used, and because the opening angle at each spatial light modulator is small, it is possible to segment the first lens in the projection system PL, thus reducing the size and amount of refractive material (e.g. quartz or $CaF_2$) needed. FIG. 13 shows this concept in more detail. The plate CP carrying the spatial light modulator may have a dimension of 100 mm or more, but the active parts of the spatial light modulators cover only small parts of the total area of the plate. Rather than have a large lens with a field of view covering the entire plate CP, the lens SL which collects the radiation from the spatial light modulators is segmented, with only those parts necessary to collect radiation from the spatial light modulators being provided. Because the numeric aperture of the illumination radiation for radiation source LS is small, the segments of the lens provided are only a small part of the whole lens. Were the whole lens to be provided, the parts omitted in the segmented lens would have little or no useful radiation passing through them.

The segmented lens SL expands the projection beam PB from the radiation system and also reduces the patterned beam from the spatial light modulators so that the beam splitter BS and projection system PL can be comparatively small in size. Of course, two or more segmented lenses may be used, depending on how quickly the sub-beams from the spatial light modulators diverge and are brought together in the optical system.

The carrier plate according to the eleventh embodiment, carrying multiple spatial light modulators, may also be used in place of the single spatial light modulators in any of the above-described embodiments.

Figure 14:
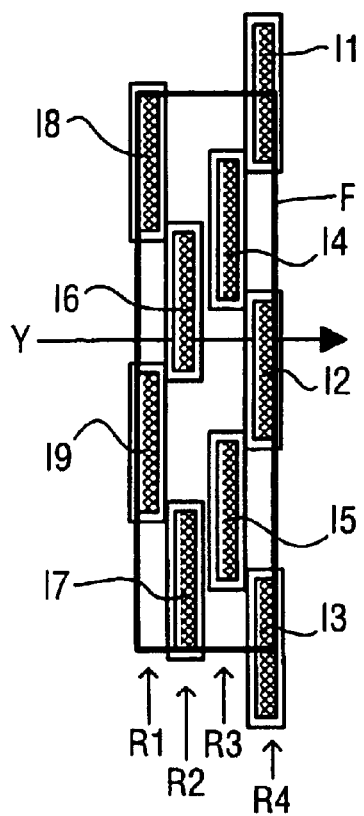
FIG. 14 depicts the arrangement of plural programmable patterning structure in an imaging apparatus according to a twelfth embodiment of the invention.

In an imaging apparatus according to a twelfth embodiment of the present invention, which may make use of the optical arrangements of any of the above embodiments, the images of the spatial light modulators are arranged as shown in FIG. 14.

As can be seen in FIG. 14, images I1 to I8 are arranged in four rows R1–R4. The rows are staggered, and the separation between images is less than the length of the images, so that the full width of the imaged field F in the direction perpendicular to the scanning direction Y is covered. In the first and second (and third and fourth) rows, the top and bottom of the images are aligned. The second and third rows R2, R3 ensure that the whole of the target area is imaged on twice, to improve uniformity and eliminate seams. During an exposure, the radiation source is pulsed one or more times every time the substrate advances a distance equal to the row spacing.

The arrangement shown in FIG. 14 can be achieved in two ways. Firstly, the spatial light modulators can be arranged on a carrier plate in the corresponding layout. In that case, the hatched area represents the active area of each spatial light modulator and the box around it the necessary mounting margin and inactive area. The field F represents the illumination field on the carrier plate, defined by masking blades.

Alternatively, the depicted arrangement can be achieved with spatial light modulators arranged as convenient, with their images being brought to the object plane of the projection system PL in the layout depicted. In this case, each of the hatched areas in the picture may be an image of an array of spatial light modulators rather than just one spatial light modulator, so that there is effectively an array of arrays.

Figure 15:
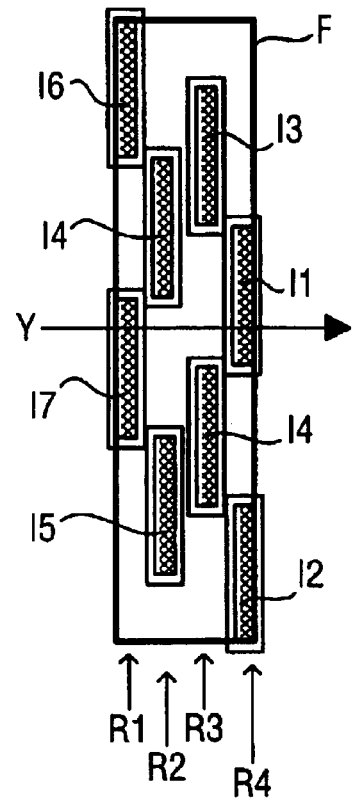
FIG. 15 depicts the arrangement of plural programmable patterning structure in an imaging apparatus according to a thirteenth embodiment of the invention.

FIG. 15 shows an arrangement of images in an imaging apparatus according to a thirteenth embodiment of the invention, which is a variant of the twelfth embodiment and may be put into practice in the same ways. The thirteenth embodiment differs from the twelfth in using one fewer spatial light modulator (or array of spatial light modulators). Images I2 and I6 are aligned with the edges of field F. Although one spatial light modulator is saved, the edge parts of the field are only imaged once in the scan.

Figure 16:
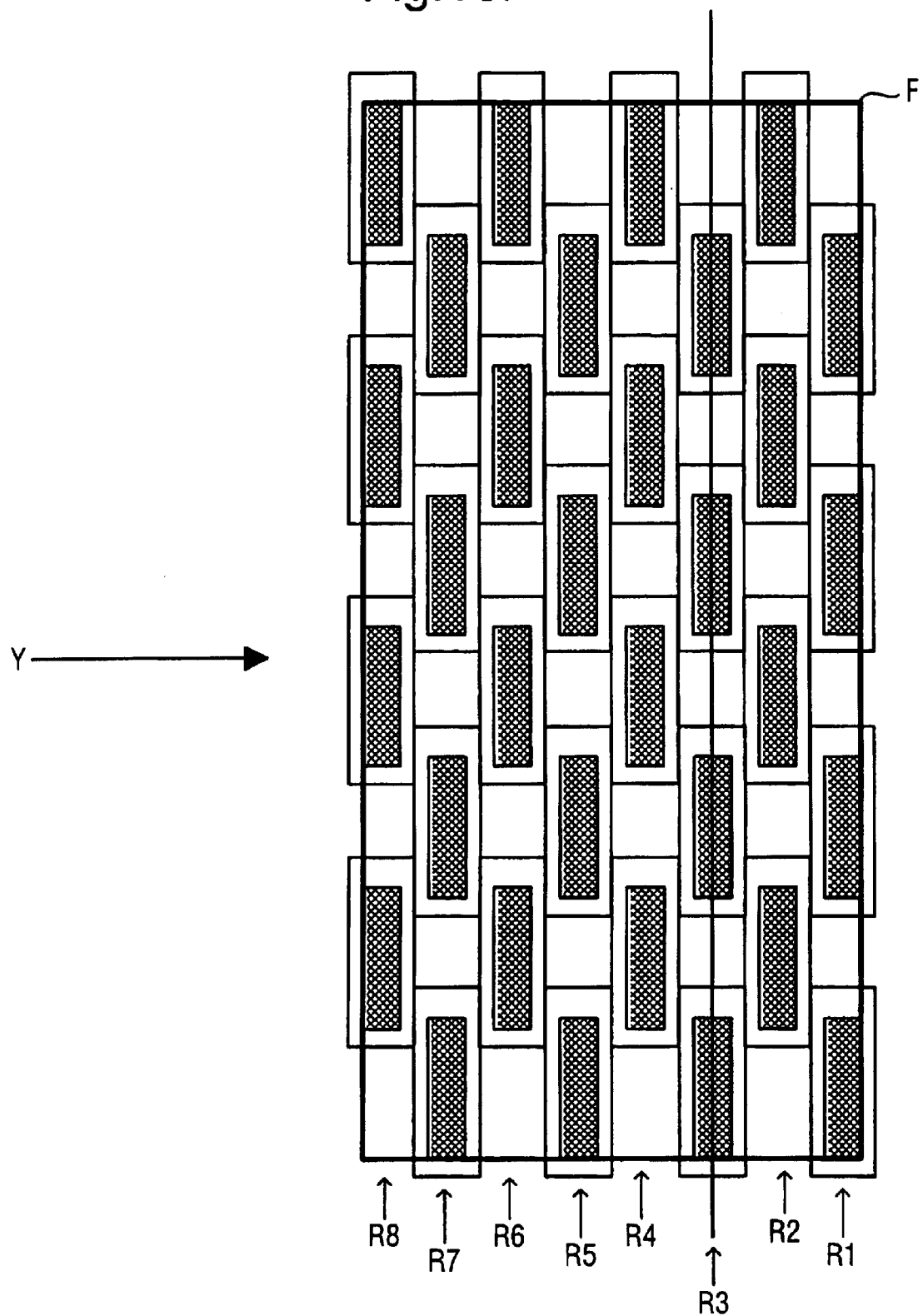
FIG. 16 depicts the arrangement of plural programmable patterning structure in an imaging apparatus according to a fourteenth embodiment of the invention.

An arrangement of images in an imaging apparatus according to a fourteenth embodiment of the invention uses a further alternative arrangement of images, depicted in FIG. 16, that can be achieved in the same ways as the twelfth embodiment. In this example, the images are arrayed in eight rows. Such an arrangement may be particularly suitable where the spatial light modulators have larger inactive areas and mounting margins.

An arrangement of images in an imaging apparatus according to a fifteenth embodiment of the invention may be particularly applicable where the active areas of the spatial light modulators are contained in large packages and can make use of off-the-shelf spatial light modulators with little or no modification. As FIG. 17 shows, four rows R1–R4 of images are used, with the tops and bottoms of the active areas of adjacent spatial light modulators being aligned. The fifteenth embodiment can be effected in the same way as the twelfth embodiment.

FIG. 18 shows the arrangement of images in an imaging apparatus according to a sixteenth embodiment of the invention which again can be effected in the same way as the thirteenth embodiment. In the sixteenth embodiment, only two rows R1, R2 of images are used to span the field F, which is relatively long and narrow. The sixteenth embodiment minimizes the number of spatial light modulators necessary at the expense of throughput.

Figure 19:
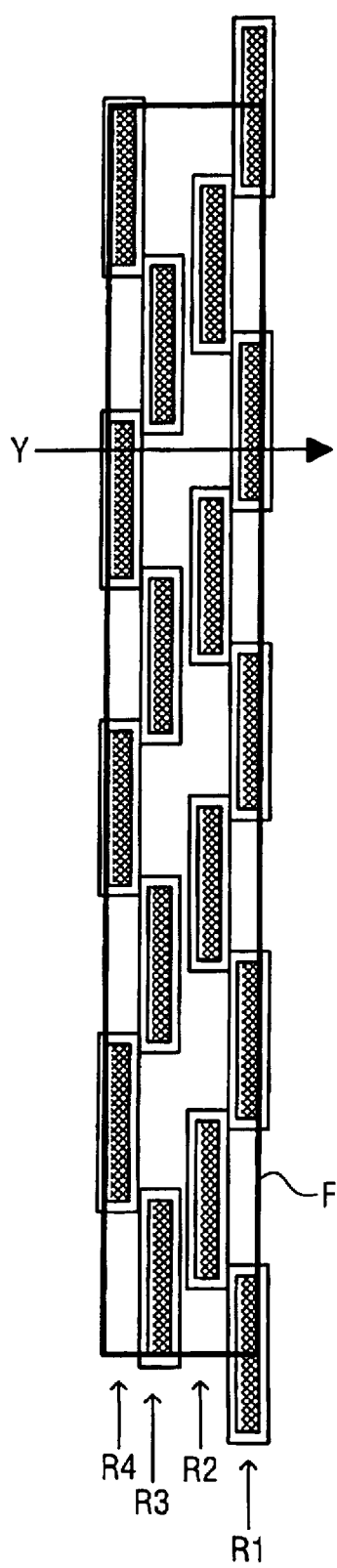
FIG. 19 depicts the arrangement of plural programmable patterning structure in an imaging apparatus according to a seventeenth embodiment of the invention.

An arrangement of images in an imaging apparatus according to a seventeenth embodiment of the invention uses an arrangement of images as shown in FIG. 19. Using four rows of images R1–R4, a relatively wide field F can be imaged with higher throughput than in the sixteenth embodiment, whilst the displacement of the third and fourth rows relative to the first and second rows eliminates seams.

Figure 20:
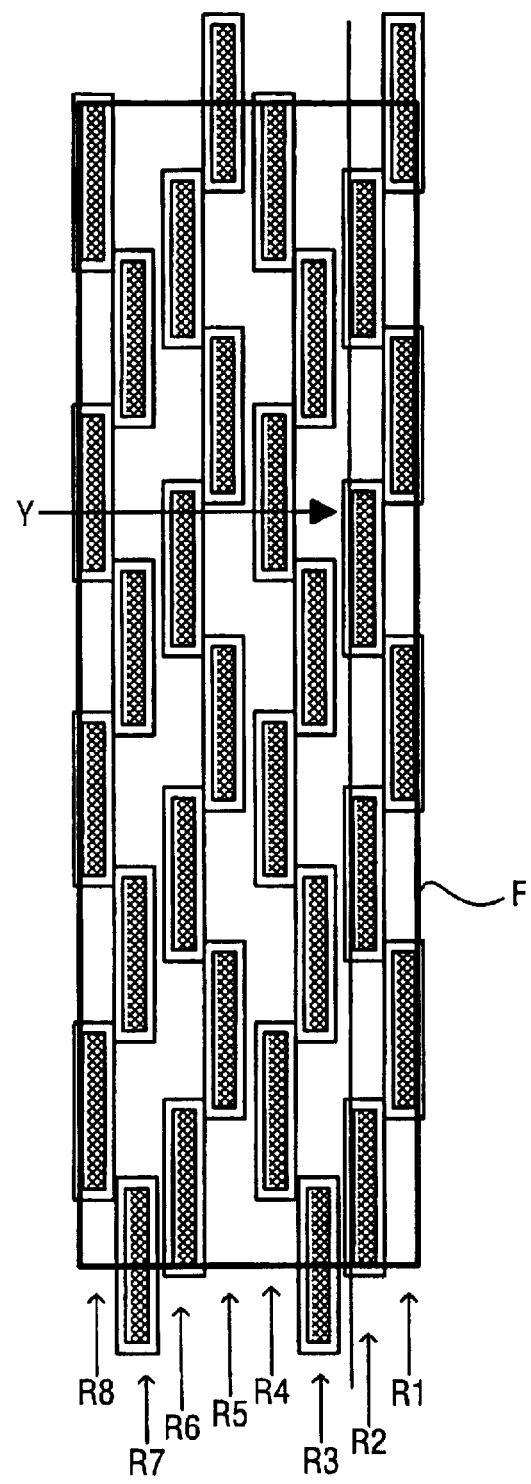
FIG. 20 depicts the arrangement of plural programmable patterning structure in an imaging apparatus according to a eighteenth embodiment of the invention.

An arrangement of images in an imaging apparatus according to a eighteenth embodiment of the present invention maximizes throughput by using eight rows R1–R8 of images to cover a large field F, as shown in FIG. 20.

Imaging apparatus according to certain embodiments of the invention as described herein may provide a greatly improved throughput as compared to existing mask writing apparatus. Such imaging apparatus may be used to manufacture integrated circuits and other (semiconductor) devices, as a commercially attractive alternative to the use of a conventional lithographic projection apparatus (employing a mask) for this purpose.

An imaging apparatus according to an embodiment of the invention employs a plurality of patterning sub-elements, each of which may, for example, be as large as the whole patterning structure in an existing direct-write apparatus. Because the sub-beams from these sub-elements are combined to produce a composite image, the throughput of the whole may be very much improved over that of an existing apparatus. This approach may be much more satisfactory than attempting to increase the size of a (single) patterning structure, since such a size increase would be accompanied by very significant (if not insurmountable) manufacturing difficulties. In particular, the chance that a mirror array, for example, would contain one or more defective mirror "pixels" would increase dramatically as the size of the array increased, leading to a drastically reduced yield and, thus, significantly increased manufacturing costs. Moreover, it is generally easier to supply data (for matrix-addressing purposes) to a plurality of patterning sub-elements as in an apparatus according to an embodiment of the invention, than to supply such data to a single, enlarged patterning structure.

Although specific reference may be made in this text to the use of the apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "wafer" or "die" in this text should be considered as being replaced by the more general terms "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

Whilst specific embodiments of the invention have been described above, it will be appreciated that the invention as claimed may be practiced otherwise than as described. For example, the principles of the invention may be applied not only in the manufacture of devices (such as semiconductor devices) with a heightened throughput, but apparatus according to embodiments of the invention may also be used to write masks at greatly increased speed. It is explicitly noted that the description of these embodiments is not intended to limit the invention as claimed.

We claim:

1. An imaging apparatus comprising:
    a radiation system configured to provide a beam of radiation;
    a programmable patterning structure configured to pattern the beam according to a desired pattern, the programmable patterning structure including a plurality of separate patterning sub-elements, each sub-element being configured to generate a patterned sub-beam;
    a combining structure configured to combine the plurality of patterned sub-beams into a single patterned image;
    at least one optical system arranged in an optical path between a corresponding one of the plurality of separate patterning sub-elements and the combining structure;
    a substrate table configured to hold a substrate; and
    a projection system configured to project the patterned image onto a target portion of the substrate,
    wherein at least one patterning sub-element is configured to generate a patterned sub-beam whose cross-section contains regions of different intensities, and
    wherein said combining structure comprises at least one among a reflector and a beam splitter.

2. The imaging apparatus according to claim 1, wherein said combining structure comprises a plurality of separate optical channels, each optical channel corresponding to one of said separate patterning sub-elements and being configured to project an image of said patterning sub-element into an object plane of said projection system.

3. The imaging apparatus according to claim 2, wherein said plurality of separate optical channels are arranged to project reduced images of said separate patterning sub-elements.

4. The imaging apparatus according to claim 1, wherein said combining structure includes a beam splitter.

5. The imaging apparatus according to claim 1, wherein said programmable patterning structure comprises first to fourth separate patterning sub-elements, and
    wherein said combining structure comprises first to third beam splitters, and
    wherein said first beam splitter is configured to combine patterned sub-beams from said first and second separate patterning sub-elements to form a first combined beam, and
    wherein said second beam splitter is configured to combine a patterned sub-beam from said third separate patterning sub-element with the first combined beam to form a second combined beam, and
    wherein said third beam splitter is configured to combine a patterned sub-beam from said fourth separate patterning sub-element with the second combined beam to form a third combined beam, and
    wherein said projection system is configured to projected the third combined beam onto the substrate.

6. The imaging apparatus according to claim 1, wherein said programmable patterning structure comprises first to fourth separate patterning sub-elements, and
    wherein said combining structure comprises first to third beam splitters, and
    wherein said first beam splitter is configured to combine patterned sub-beams from said first and second separate patterning sub-elements to form a first combined beam, and
    wherein said second beam splitter is configured to combine patterned sub-beams from said third and fourth separate patterning sub-elements to form a second combined beam, and
    wherein said third beam splitter is configured to combine the first combined beam with the second combined beam to form a third combined beam, and
    wherein said projection system is configured to projected the third combined beam onto the substrate.

7. The imaging apparatus according to claim 1, wherein said separate patterning sub-elements are arranged around an imaginary circle parallel to the object plane, and
    wherein said apparatus comprises a plurality of optical systems, each optical system corresponding to one of said separate patterning sub-elements and having an optical axis extending generally radially of said imaginary circle, and a corresponding plurality of folding mirrors, each folding mirror configured to direct a beam output by said corresponding optical system to intersect the object plane.

8. The imaging apparatus according to claim 7, further comprising an additional separate patterning sub-element and an additional optical system having an optical axis intersecting said object plane and configured to project an image of said additional separate patterning sub-element onto the object plane.

9. The imaging apparatus according to claim 7, wherein each optical system is configured to process a corresponding one of the plurality of patterned sub-beams.

10. The imaging apparatus according to claim 1, wherein said combining structure comprises a segmented lens forming the first element in said projection system.

11. The imaging apparatus according to claim 1, wherein each separate patterning sub-element comprises an array of individually controllable radiation modulating devices.

12. The imaging apparatus according to claim 11, wherein said plurality of separate patterning sub-elements are mounted in a staggered array on a carrier plate.

13. The imaging apparatus according to claim 1, wherein each of said separate patterning sub-elements comprises a carrier plate having mounted thereon a plurality of separate arrays of individually controllable radiation modulating devices, said separate arrays being mounted in a staggered array.

14. The imaging apparatus according to claim 11, wherein each of said individually controllable radiation modulating devices comprises at least one among a pixel of a liquid crystal device and a moveable mirror.

15. The imaging apparatus according to claim 1, wherein said substrate table is further configured to scan the substrate in a first direction during exposure of the target portion, and wherein the single patterned image includes a staggered array having at least first and second rows of sub-images, each sub-image corresponding to one among the plurality of patterned sub-beams, and wherein each of the first and second rows extends in a second direction perpendicular to the first direction, and wherein the dimensions of the sub-images in the second direction are greater than the spaces between adjacent sub-images in the second direction, and wherein the sub-images of the second row are aligned along the first direction with spaces between sub-images of the first row.

16. The imaging apparatus according to claim 15, wherein the staggered array has third and fourth rows of sub-images, and wherein each of the third and fourth rows extends in a second direction perpendicular to the first direction, and wherein the first and third rows are on opposite sides of the second row, and wherein sub-images of the third row are offset from sub-images of the first row along said second direction by a first offset distance less than the length in the second direction of one of the sub-images, and wherein the second and fourth rows are on opposite sides of the third row, and wherein sub-images of the fourth row are offset from sub-images of the second row along said second direction by the first offset distance.

17. The imaging apparatus according to claim 15, wherein each of the sub-images includes a staggered array of images of separate arrays of individually controllable radiation modulating devices.

18. The imaging apparatus according to claim 1, wherein said combining structure comprises a three-way beam splitter and two folding mirrors.

19. The imaging apparatus according to claim 1, wherein said at least one optical system includes a contrast aperture.

20. The imaging apparatus according to claim 1, wherein said at least one optical system includes Scheimpflug optics.

21. The imaging apparatus according to claim 1, wherein said at least one optical system is configured to reduce an image of the corresponding patterning sub-element.

22. A device manufacturing method, said method comprising:

using a radiation system to provide a beam of radiation;

generating a plurality of patterned sub-beams based on the beam, at least one sub-beam having a cross-section that contains regions of different intensities;

combining the plurality of patterned sub-beams into a single patterned image;

passing at least one of the patterned sub-beams through an optical system prior to said combining, and projecting the patterned image onto a target portion of a layer of radiation-sensitive material that at least partially covers a substrate, wherein said combining includes at least one among (1) using a reflector to reflect the at least one patterned sub-beam and (2) passing the at least one patterned sub-beam through a beam splitter.

23. The device manufacturing method according to claim 22, said method further comprising scanning the substrate in a first direction during exposure of the target portion, and wherein the single patterned image includes a staggered array having at least first and second rows of sub-images, each sub-image corresponding to one among the plurality of patterned sub-beams, and wherein each of the first and second rows extends in a second direction perpendicular to the first direction, and wherein the dimensions of the sub-images in the second direction are greater than the spaces between adjacent sub-images in the second direction, and wherein the sub-images of the second row are aligned along the first direction with spaces between sub-images of the first row.

24. A device manufactured according to the method of claim 22.

25. The device manufacturing method according to claim 22, wherein said passing at least one of the patterned sub-beams through an optical system includes reducing an image of the corresponding patterning sub-element.

26. The device manufacturing method according to claim 22, wherein said passing at least one of the patterned sub-beams through an optical system includes passing the patterned sub-beam through a contrast aperture.

27. The device manufacturing method according to claim 22, wherein said combining includes passing at least three of the patterned sub-beams through a single beam-splitter.

28. The device manufacturing method according to claim 22, wherein said combining includes projecting the patterned image onto a segmented lens element.

* * * * *